United States Patent
Tsukamoto et al.

(10) Patent No.: US 11,776,786 B2
(45) Date of Patent: Oct. 3, 2023

(54) FOCUS ADJUSTMENT METHOD FOR CHARGED PARTICLE BEAM DEVICE AND CHARGED PARTICLE BEAM DEVICE

(71) Applicant: JEOL Ltd., Tokyo (JP)

(72) Inventors: Kazunori Tsukamoto, Tokyo (JP); Yuki Chiba, Tokyo (JP)

(73) Assignee: JEOL Ltd., Tokyo (JP)

( * ) Notice: Subject to any disclaimer, the term of this patent is extended or adjusted under 35 U.S.C. 154(b) by 736 days.

(21) Appl. No.: 16/940,856

(22) Filed: Jul. 28, 2020

(65) Prior Publication Data
US 2021/0035772 A1    Feb. 4, 2021

(30) Foreign Application Priority Data
Jul. 29, 2019 (JP) .................................. 2019-138997

(51) Int. Cl.
*H01J 37/21* (2006.01)
*H01J 37/14* (2006.01)
*H01J 37/28* (2006.01)
*H01J 37/22* (2006.01)

(52) U.S. Cl.
CPC .............. *H01J 37/21* (2013.01); *H01J 37/14* (2013.01); *H01J 37/22* (2013.01); *H01J 37/28* (2013.01); *H01J 2237/216* (2013.01)

(58) Field of Classification Search
CPC ............. H01J 37/21; H01J 37/14; H01J 37/28
See application file for complete search history.

(56) References Cited

U.S. PATENT DOCUMENTS

| | | | |
|---|---|---|---|
| 5,729,022 A * | 3/1998 | Veneklasen | H01J 37/141 335/210 |
| 10,176,965 B1* | 1/2019 | Breuer | H01J 37/10 |
| 2005/0072920 A1 | 4/2005 | Inada | |
| 2017/0018402 A1* | 1/2017 | Frosien | H01J 37/261 |

FOREIGN PATENT DOCUMENTS

| | | |
|---|---|---|
| JP | H01220351 A | 9/1989 |
| JP | H5258696 A | 10/1993 |
| JP | 2005108567 A | 4/2005 |

OTHER PUBLICATIONS

Office Action issued in JP 2019138997 dated Jun. 1, 2021.

* cited by examiner

*Primary Examiner* — Joseph L Williams
(74) *Attorney, Agent, or Firm* — THE WEBB LAW FIRM (57) ABSTRACT

A focus adjustment method for a charged particle beam device having a magnetic field lens used for focus adjustment and an astigmatism corrector includes: acquiring a plurality of first images by varying an excitation current of the magnetic field lens within a focus search range, and determining a reference value of the excitation current; removing hysteresis from the magnetic field lens by setting the excitation current of the magnetic field lens outside the focus search range before and after varying the excitation current of the magnetic field lens within the focus search range; and acquiring a plurality of second images by varying the excitation current of the magnetic field lens using the reference value as a reference and varying a stigma correction value of the astigmatism corrector at each excitation current, and then determining optimum values of the excitation current and the stigma correction value.

6 Claims, 5 Drawing Sheets

FOCUS ADJUSTMENT METHOD FOR CHARGED PARTICLE BEAM DEVICE AND CHARGED PARTICLE BEAM DEVICE

CROSS-REFERENCE TO RELATED APPLICATIONS

This application claims priority to Japanese Patent Application No. 2019-138997, filed Jul. 29, 2019, the disclosure of which is hereby incorporated by reference in its entirety.

BACKGROUND OF THE INVENTION

Field of the Invention

The present invention relates to a focus adjustment method for a charged particle beam device, and a charged particle beam device.

Description of Related Art

In a scanning electron microscope, an electron probe microanalyzer, or the like, it is necessary to adjust the focus and correct astigmatism in order to acquire favorable electron microscope images.

JP-A-1-220351 discloses an electron microscope in which focus adjustment is performed automatically.

In an electron microscope, a magnetic field lens is typically employed as a lens used for focus adjustment. Focus adjustment is performed by, for example, varying the excitation current of the magnetic field lens used for focus adjustment in order to find a focus position. Here, when searching for the focus position, the excitation current of the lens used for focus adjustment is varied widely. However, when the excitation current of the lens used for focus adjustment is varied widely, focus adjustment cannot be performed with a high degree of precision due to the effects of hysteresis in the magnetic field lens.

SUMMARY OF THE INVENTION

According to a first aspect of the invention, there is provided a focus adjustment method for a charged particle beam device having a magnetic field lens used for focus adjustment and an astigmatism corrector, the focus adjustment method including:

acquiring a plurality of first images having different focuses by varying an excitation current of the magnetic field lens within a focus search range, and determining a reference value of the excitation current of the magnetic field lens based on the plurality of first images;

removing hysteresis from the magnetic field lens by setting the excitation current of the magnetic field lens outside the focus search range before varying the excitation current of the magnetic field lens within the focus search range;

removing hysteresis from the magnetic field lens by setting the excitation current of the magnetic field lens outside the focus search range after varying the excitation current of the magnetic field lens within the focus search range; and acquiring a plurality of second images having different focuses and different astigmatisms by varying the excitation current of the magnetic field lens using the reference value as a reference and varying a stigma correction value of the astigmatism corrector at each excitation current, and then determining an optimum value of the excitation current of the magnetic field lens and an optimum value of the stigma correction value based on the plurality of second images.

According to a second aspect of the invention, there is provided a charged particle beam device including:

a magnetic field lens used for focus adjustment;
an astigmatism corrector; and
a control unit for controlling the magnetic field lens and the astigmatism corrector,
the control unit performing:

processing for acquiring a plurality of first images having different focuses by varying an excitation current of the magnetic field lens within a focus search range, and determining a reference value of the excitation current of the magnetic field lens based on the plurality of first images;

processing for removing hysteresis from the magnetic field lens by setting the excitation current of the magnetic field lens outside the focus search range before varying the excitation current of the magnetic field lens within the focus search range;

processing for removing hysteresis from the magnetic field lens by setting the excitation current of the magnetic field lens outside the focus search range after varying the excitation current of the magnetic field lens within the focus search range; and processing for acquiring a plurality of second images having different focuses and different astigmatisms by varying the excitation current of the magnetic field lens using the reference value as a reference and varying a stigma correction value of the astigmatism corrector at each excitation current, and then determining an optimum value of the excitation current of the magnetic field lens and an optimum value of the stigma correction value based on the plurality of second images.

DESCRIPTION OF THE INVENTION (1) According to an embodiment of the invention, there is provided a focus adjustment method for a charged particle beam device having a magnetic field lens used for focus adjustment and an astigmatism corrector, the focus adjustment method including:

acquiring a plurality of first images having different focuses by varying an excitation current of the magnetic field lens within a focus search range, and determining a reference value of the excitation current of the magnetic field lens based on the plurality of first images;

removing hysteresis from the magnetic field lens by setting the excitation current of the magnetic field lens outside the focus search range before varying the excitation current of the magnetic field lens within the focus search range;

removing hysteresis from the magnetic field lens by setting the excitation current of the magnetic field lens outside the focus search range after varying the excitation current of the magnetic field lens within the focus search range; and acquiring a plurality of second images having different focuses and different astigmatisms by varying the excitation current of the magnetic field lens using the reference value as a reference and varying a stigma correction value of the astigmatism corrector at each excitation current, and then determining an optimum value of the excitation current of the magnetic field lens and an optimum value of the stigma correction value based on the plurality of second images.

With this focus adjustment method for a charged particle beam device, hysteresis is removed from the magnetic field lens before and after the excitation current of the magnetic field lens is varied within the focus search range, or in other words before and after the excitation current of the magnetic field lens is varied widely, and therefore the effects of hysteresis in the magnetic field lens can be reduced. Moreover, the optimum value of the stigma correction value is determined by varying the excitation current of the magnetic field lens using the reference value of the excitation current as a reference, and therefore the amount by which the excitation current of the magnetic field lens is varied while determining the optimum value of the stigma correction value can be reduced. As a result, the effects of hysteresis in the magnetic field lens can be reduced.

(2) According to an embodiment of the invention, there is provided a charged particle beam device including:

a magnetic field lens used for focus adjustment;

an astigmatism corrector; and a control unit for controlling the magnetic field lens and the astigmatism corrector, the control unit performing:

processing for acquiring a plurality of first images having different focuses by varying an excitation current of the magnetic field lens within a focus search range, and determining a reference value of the excitation current of the magnetic field lens based on the plurality of first images;

processing for removing hysteresis from the magnetic field lens by setting the excitation current of the magnetic field lens outside the focus search range before varying the excitation current of the magnetic field lens within the focus search range;

processing for removing hysteresis from the magnetic field lens by setting the excitation current of the magnetic field lens outside the focus search range after varying the excitation current of the magnetic field lens within the focus search range; and processing for acquiring a plurality of second images having different focuses and different astigmatisms by varying the excitation current of the magnetic field lens using the reference value as a reference and varying a stigma correction value of the astigmatism corrector at each excitation current, and then determining an optimum value of the excitation current of the magnetic field lens and an optimum value of the stigma correction value based on the plurality of second images.

With this charged particle beam device, the control unit removes hysteresis from the magnetic field lens before and after varying the excitation current of the magnetic field lens within the focus search range, or in other words before and after widely varying the excitation current of the magnetic field lens, and therefore the effects of hysteresis in the magnetic field lens can be reduced. Moreover, the control unit determines the optimum value of the stigma correction value by varying the excitation current of the magnetic field lens using the reference value of the excitation current as a reference, and therefore the amount by which the excitation current of the magnetic field lens is varied while determining the optimum value of the stigma correction value can be reduced. As a result, the effects of hysteresis in the magnetic field lens can be reduced.

Embodiments of the invention are described in detail below with reference to the drawings. It is noted that the following embodiments do not unduly limit the scope of the invention as stated in the claims. In addition, all of the elements described below are not necessarily essential requirements of the invention.

Furthermore, an electron microscope that performs specimen observation by irradiating the specimen with an electron beam is described below as an example of the charged particle beam device according to the invention, but the charged particle beam device according to the invention may also be a device that performs specimen observation by irradiating the specimen with a charged particle beam (an ion beam or the like) other than an electron beam. A scanning electron microscope, a transmission electron microscope, a scanning transmission electron microscope, an electron probe microanalyzer, a focused ion beam device, or the like, for example, may be used as the charged particle beam device according to the invention.

1. Electron Microscope

Figure 1:
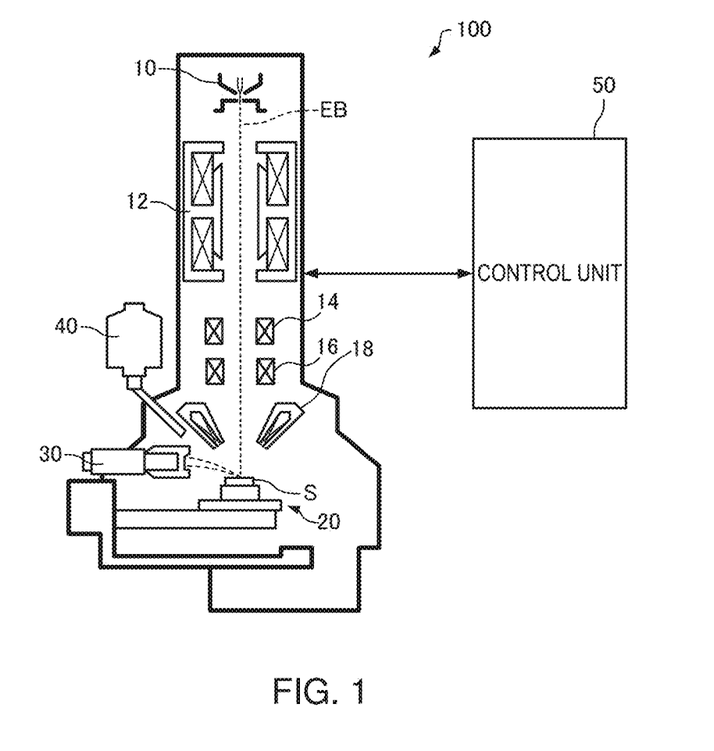
FIG. 1 is a diagram illustrating a configuration of an electron microscope according to an embodiment of the invention.

First, an electron microscope according to an embodiment of the invention will be described with reference to the drawing. FIG. 1 is a diagram illustrating a configuration of an electron microscope 100 according to an embodiment of the invention. The electron microscope 100 is a scanning electron microscope.

As illustrated in FIG. 1, the electron microscope 100 includes an electron gun 10, a condenser lens 12, a deflector 14, an astigmatism corrector 16, an objective lens 18, a specimen stage 20, an electron detector 30, an energy-dispersive X-ray detector 40, and a control unit 50.

The electron gun 10 generates an electron beam EB. The electron gun 10 emits the electron beam EB toward a specimen S after accelerating the electron beam EB by a predetermined accelerating voltage.

The condenser lens 12 is a lens for condensing the electron beam EB emitted from the electron gun 10. The deflector 14 deflects the electron beam EB two-dimensionally. Using the deflector 14, an electron probe can be caused to scan the specimen S.

The astigmatism corrector 16 corrects astigmatism. Using the astigmatism corrector 16, astigmatism can be corrected by creating astigmatism of an identical strength to the astigmatism of the lens in an orthogonal direction thereto. The control unit 50 sets a stigma correction value, whereupon the astigmatism corrector 16 creates astigmatism corresponding to the set stigma correction value.

The objective lens 18 is a lens for condensing the electron beam EB on the specimen S. The electron probe is formed by condensing the electron beam EB using the condenser lens 12 and the objective lens 18.

The objective lens 18 is a magnetic field lens that is caused to generate a lens action using a magnetic field. The objective lens 18 includes an electromagnetic field coil for generating a magnetic field, and the strength of the lens action can be controlled in accordance with an excitation current supplied to the electromagnetic field coil. The objective lens 18 functions as a focus adjustment lens.

Note that the focus adjustment lens may be constituted by a plurality of lenses. For example, the focus adjustment lens may be a combination of the objective lens 18 and an aperture angle control lens, not shown in the drawing. An aperture angle control lens is a lens for automatically optimizing an aperture angle with respect to the objective lens 18.

The specimen stage 20 supports the specimen S. The specimen S is placed on the specimen stage 20. Although not shown in the drawing, the specimen stage 20 includes a moving mechanism for moving the specimen S. By moving the specimen S using the specimen stage 20, the position in which the specimen S is irradiated with the electron beam EB can be moved.

The electron detector 30 is a detector for detecting electrons emitted from the specimen S. By detecting the electrons emitted from the specimen S using the electron detector 30, a scanning electron microscope image (an SEM image) can be acquired. The electron detector 30 may be a backscattered-electron detector that detects backscattered electrons or a secondary electron detector that detects secondary electrons.

The energy-dispersive X-ray detector 40 is a detector for acquiring an EDS spectrum by separating X-rays by energy. The energy-dispersive X-ray detector 40 detects a characteristic X-ray generated by the specimen S when the specimen S is irradiated with the electron beam EB.

The control unit 50 controls the respective constituent units of the electron microscope 100. For example, the control unit 50 is a computer including a central processing unit (CPU) and a storage device (a random access memory (RAM), a read only memory (ROM), or the like). The control unit 50 can perform various types of calculation processing and various types of control processing by having the CPU execute a program stored in the storage device. The processing performed by the control unit 50 will be described in detail below in "2. Operation".

2. Operation

Next, an operation of the electron microscope 100 will be described. In the electron microscope 100, focus adjustment is performed automatically. A focus adjustment method employed in the electron microscope 100 will be described below.

Figure 2:
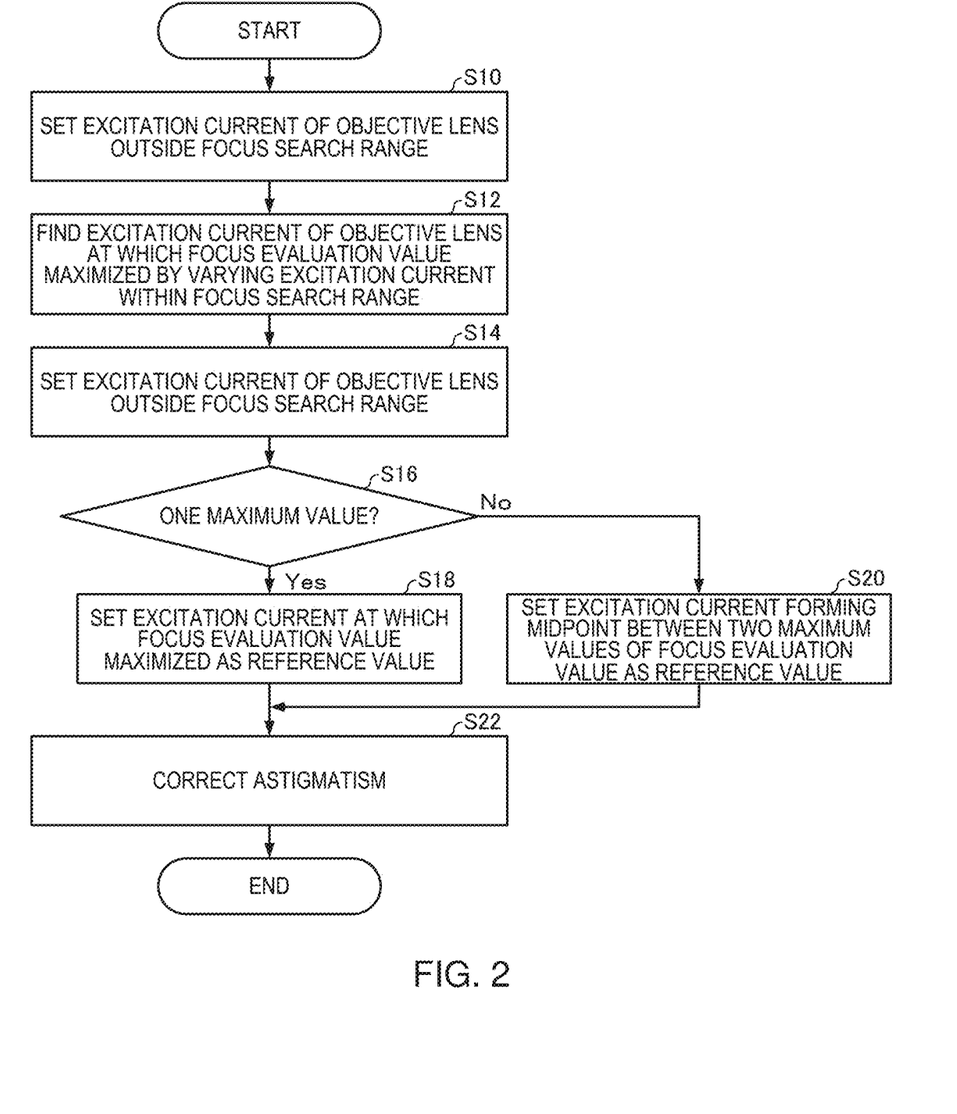
FIG. 2 is a flowchart illustrating an example of processing executed by a control unit.
Figure 3:
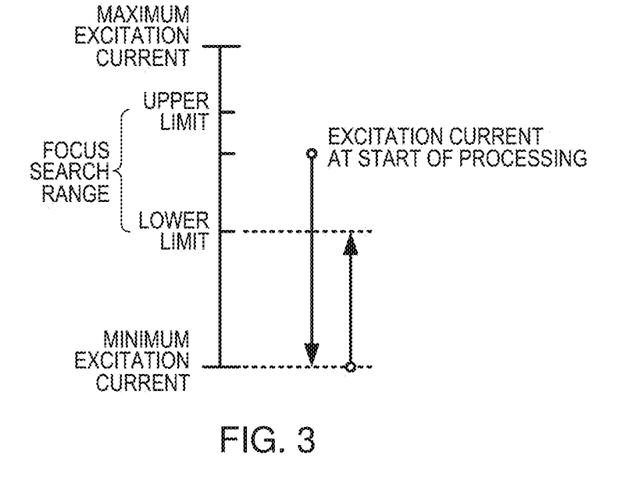
FIG. 3 is a diagram illustrating processing for removing hysteresis from an objective lens.
Figure 4:
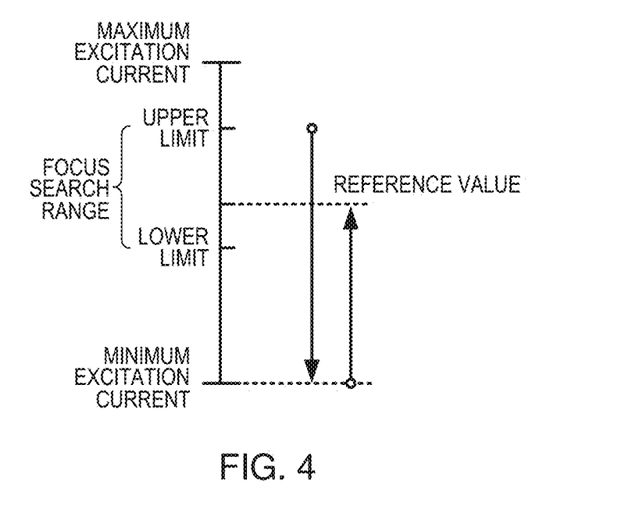
FIG. 4 is a diagram illustrating processing for removing hysteresis from an objective lens.

FIG. 2 is a flowchart illustrating an example of the processing executed by the control unit 50. FIGS. 3 and 4 are diagrams illustrating processing for removing hysteresis from the objective lens 18.

When a user inputs a command to start focus adjustment processing through an operation unit, not shown in the drawing, the control unit 50 starts the focus adjustment processing.

First, the control unit 50 sets the excitation current of the objective lens 18 outside a focus search range (S10).

As illustrated in FIG. 3, the control unit 50 sets the excitation current of the objective lens 18 outside the focus search range from the excitation current at the start of the processing. For example, the excitation current of the objective lens 18 is set at a minimum excitation current from the excitation current at the start of the processing. Next, the control unit 50 keeps the excitation current of the objective lens 18 outside the focus search range for a predetermined time. In so doing, hysteresis can be removed from the objective lens 18. The minimum excitation current is a minimum value of the excitation current supplied to the objective lens 18. Note that in this processing, as long as the excitation current of the objective lens 18 is set to be smaller than the lower limit of the focus search range, the excitation current of the objective lens 18 is not limited to the minimum excitation current. Further, in this processing, the excitation current of the objective lens 18 may be set at a larger excitation current than the upper limit of the focus search range. For example, the excitation current of the objective lens 18 may be set at a maximum excitation current. Likewise in this case, hysteresis can be removed from the objective lens 18. The maximum excitation current is a maximum value of the excitation current supplied to the objective lens 18.

Next, the control unit 50 acquires a plurality of SEM images having different focuses by varying the excitation current of the objective lens 18 within the focus search range, and searches for the excitation current at which a focus evaluation value is maximized (S12).

The control unit 50 sets the objective lens 18 at the lower limit current of the focus search range from the minimum excitation current. Then, while varying the excitation current of the objective lens 18 from the lower limit toward the upper limit of the focus search range, or in other words while varying the objective lens 18 from weak excitation to strong excitation, the control unit 50 acquires a SEM image (an example of a first image) at each excitation current. For example, the control unit 50 varies the excitation current within the focus search range +1 step at a time from the lower limit to the upper limit, and acquires a SEM image at each step. The control unit 50 determines a focus evaluation value for each excitation current (each step) from the SEM images acquired at the respective excitation currents (the respective steps).

Here, +1 step denotes varying the excitation current of the objective lens 18 by a minimum unit toward the strong excitation side. Note that −1 step, as will be described below, denotes varying the excitation current of the objective lens 18 by the minimum unit toward the weak excitation side.

The focus evaluation value is a value for evaluating the focus. The focus evaluation value takes a smaller value as focus deviation increases, and a maximum value when focusing is achieved. The focus evaluation value is an evaluation value acquired by a contrast method, for example, so that a steadily higher value is acquired as the contrast of the SEM image increases. In other words, the control unit 50 determines the focus evaluation value at each excitation current based on the SEM images acquired at the respective excitation currents.

Note that the method for evaluating the focus is not limited to the contrast method described above, and various well-known methods may be used. For example, the focus may be evaluated by a Fourier transform method, which makes use of the fact that high-frequency components increase as the sharpness of the SEM image increases.

Furthermore, in the case described above, the control unit 50 determines the focus evaluation value at each excitation current by varying the excitation current from the lower limit to the upper limit of the focus search range, but instead, the control unit 50 may vary the excitation current from the lower limit to the upper limit of the focus search range and terminate the processing of step S12 at the point where the maximum focus evaluation value is found.

Next, the control unit 50 sets the excitation current of the objective lens 18 outside the focus search range (S14).

As illustrated in FIG. 4, the control unit 50 sets the excitation current of the objective lens 18 outside the focus search range from the upper limit of the focus search range. For example, the excitation current of the objective lens 18 is set at the minimum excitation current. Next, the control unit 50 keeps the excitation current of the objective lens 18 outside the focus search range for a predetermined time. In so doing, hysteresis can be removed from the objective lens 18. The processing of step S14 is performed in a similar manner to the processing of step S10 described above. Hence, in this embodiment, the processing for removing hysteresis (S10, S14) is performed before and after varying the excitation current of the objective lens 18 within the focus search range.

Next, when the number of maximum values of the focus evaluation value found in the processing of step S12 is one (Yes in S16), the control unit 50 sets the excitation current of the objective lens 18 at which the focus evaluation value is maximized as a reference value of the excitation current of the objective lens 18 (S18).

When, on the other hand, the number of maximum values of the focus evaluation value found in the processing of step S12 is not one, or in other words when two maximum values are found, the control unit 50 sets the excitation current of the objective lens 18 forming the midpoint between the two maximum values as the reference value of the excitation current of the objective lens 18 (S20).

Figure 5:
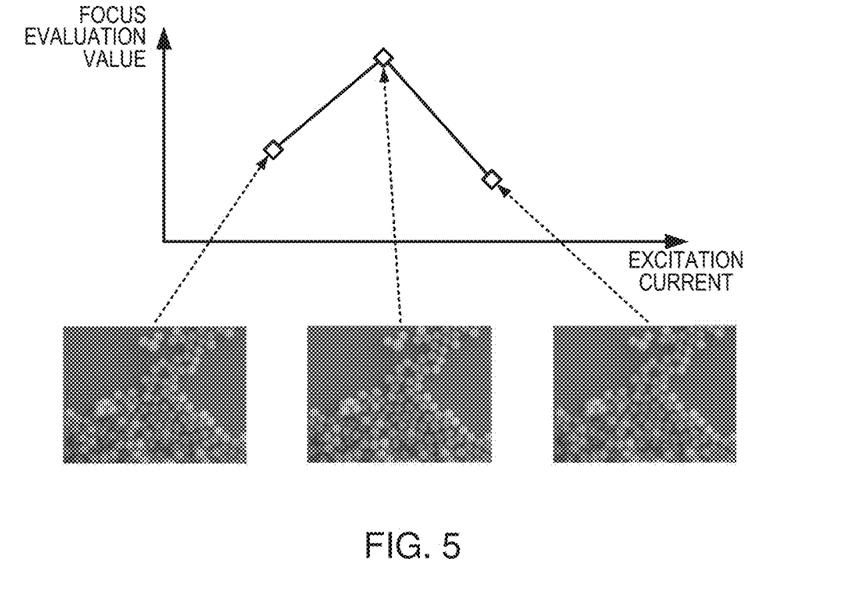
FIG. 5 is a diagram illustrating processing for setting a reference value of an excitation current of an objective lens.
Figure 6:
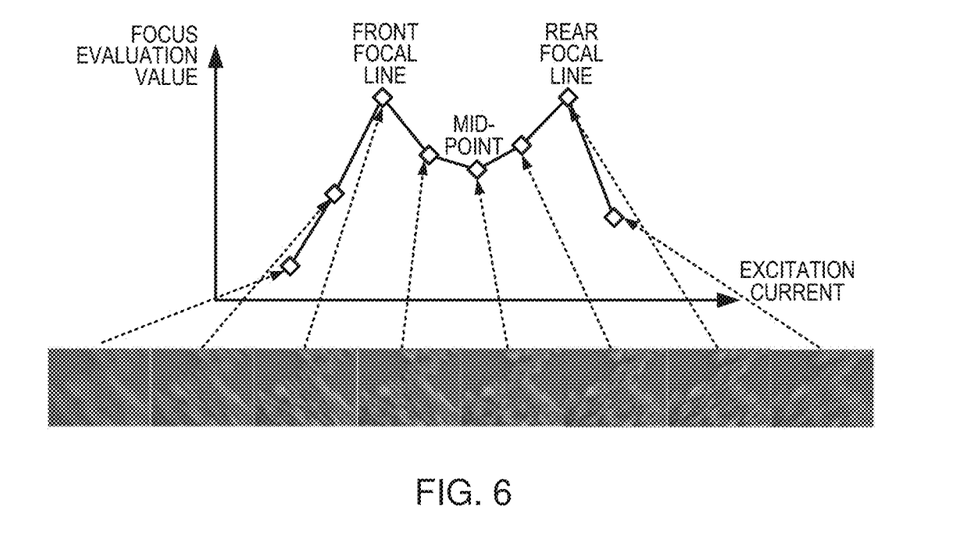
FIG. 6 is a diagram illustrating processing for setting a reference value of an excitation current of an objective lens.

FIGS. 5 and 6 are diagrams illustrating the processing for setting the reference value of the excitation current of the objective lens 18. Note that FIG. 5 illustrates a case in which the focus evaluation value has one maximum value, and FIG. 6 illustrates a case in which the focus evaluation value has two maximum values. Further, FIGS. 5 and 6 illustrate the SEM images acquired at the respective excitation currents and the focus evaluation values determined from the SEM images.

When the focus evaluation value has one maximum value, as illustrated in FIG. 5, focusing is achieved at the excitation current at which the focus evaluation value is maximized. Therefore, the excitation current at which the focus evaluation value is maximized is set as the reference value.

When the focus evaluation value has two maximum values, or more specifically when both a maximum value generated in a focus position (a front focal line) on an under-focus side and a maximum value generated in a focus position (a rear focal line) on an over-focus side exist, as illustrated in FIG. 6, the excitation current forming the midpoint between the two maximum values is set as the reference value. The position of the midpoint between the two maximum values is the position of the disk of least confusion.

The control unit 50 sets the reference value of the excitation current of the objective lens 18 in the manner described above. The control unit 50 then sets the excitation current of the objective lens 18 at the set reference value. In so doing, a focused state can be achieved.

Hence, the control unit 50 acquires a plurality of SEM images having different focuses by varying the excitation current of the objective lens 18 within the focus search range, and sets the reference value of the excitation current of the objective lens 18 based on the plurality of SEM images (S12, S16, S18, S20).

Next, the control unit 50 corrects astigmatism using the astigmatism corrector 16 (S22). More specifically, the control unit 50 acquires a plurality of SEM images having different focuses and different astigmatisms by varying the excitation current of the objective lens 18 using the set reference value as a reference and varying the stigma correction value of the astigmatism corrector 16 at each excitation current. The control unit 50 then determines an optimum value of the excitation current of the objective lens 18 and an optimum value of the stigma correction value based on the acquired plurality of SEM images.

Varying the excitation current of the objective lens 18 using the reference value as a reference includes varying the excitation current to either the strong excitation side or the weak excitation side using the reference value as an initial value, for example.

The optimum value of the excitation current of the objective lens 18 is the excitation current of the objective lens 18 at which focus deviation is minimized. Further, the optimum value of the stigma correction value of the astigmatism corrector 16 is a control value (an excitation current, for example) of the astigmatism corrector 16 at which astigmatism in the objective lens 18 is minimized.

Figure 7:
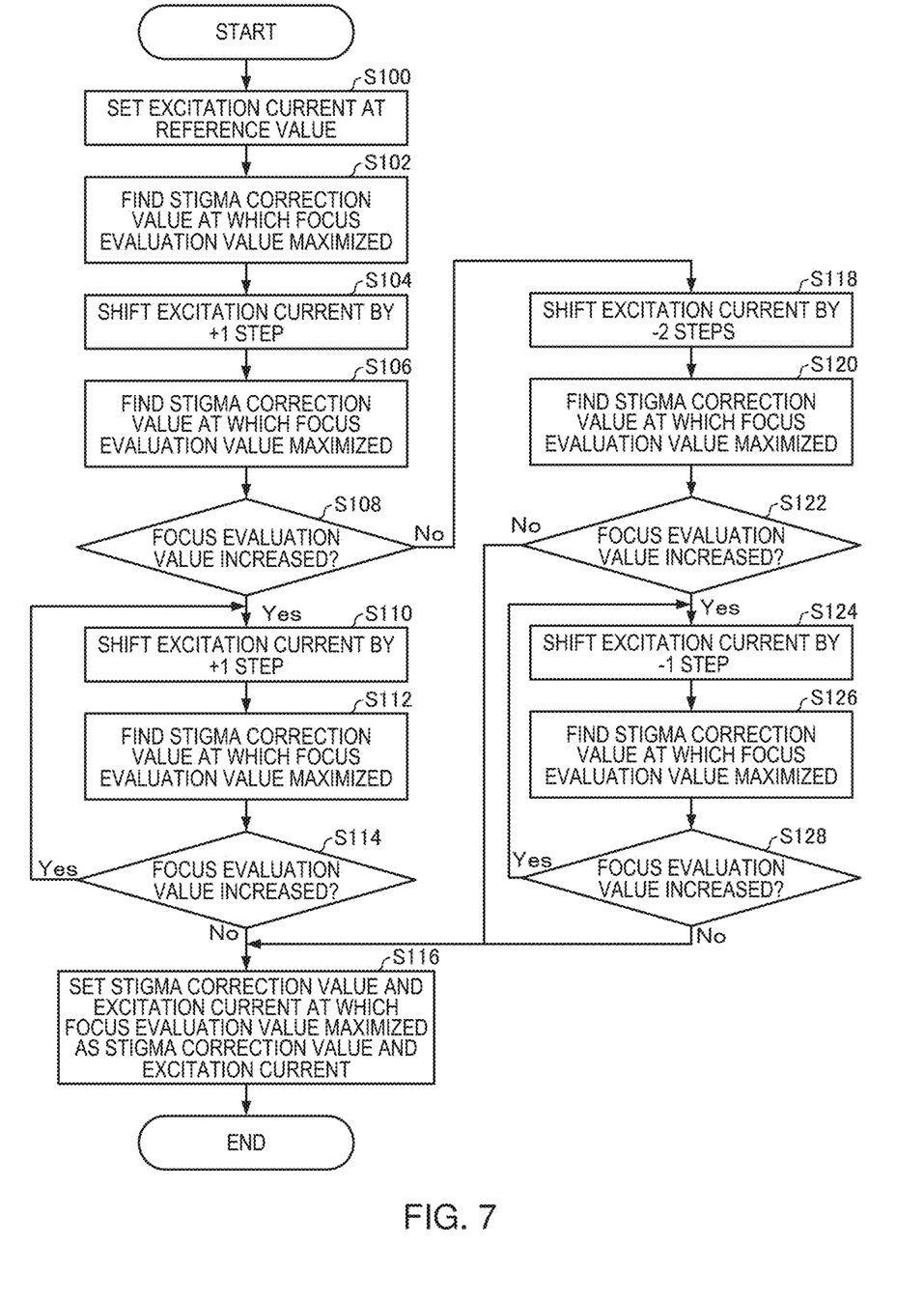
FIG. 7 is a flowchart illustrating an example of processing for correcting astigmatism.

FIG. 7 is a flowchart illustrating an example of the processing (S22) for correcting astigmatism.

The control unit 50 sets the excitation current of the objective lens 18 at the reference value determined in the processing of step S18 or step S20 (S100). As a result, a focused state is achieved.

Next, the control unit 50 searches for the stigma correction value of the astigmatism corrector 16 at which the focus evaluation value is maximized by varying the stigma correction value with the excitation current of the objective lens 18 set at the reference value (S102).

For example, the control unit 50 acquires a plurality of SEM images (an example of second images) having different stigma correction values by capturing SEM images while modifying the stigma correction value of the astigmatism corrector 16. The control unit 50 then determines a focus evaluation value for each of the plurality of SEM images, and acquires the stigma correction value at which the focus evaluation value is maximized. Thus, the optimum value of the stigma correction value when the excitation current of the objective lens 18 is set at the reference value can be acquired.

Next, the control unit 50 shifts the excitation current of the objective lens 18 by +1 step from the reference value (S104).

Next, the control unit 50 searches for the stigma correction value at which the focus evaluation value is maximized by varying the stigma correction value of the astigmatism corrector 16 with the excitation current of the objective lens 18 shifted by +1 step from the reference value (S106). The processing of step S106 is performed in a similar manner to the processing of step S102. Thus, the optimum value of the stigma correction value when the excitation current of the objective lens 18 is shifted by +1 step from the reference value can be acquired.

Next, the control unit 50 compares the maximum value of the focus evaluation value when the excitation current of the objective lens 18 is set at the reference value, acquired in the processing of step S102, with the maximum value of the focus evaluation value when the excitation current of the objective lens 18 is shifted by +1 step from the reference value, acquired in the processing of step S106 (S108). In so doing, it is possible to ascertain which of these states results in more favorable focusing and less astigmatism.

Having determined that the maximum value of the focus evaluation value when the excitation current is shifted by +1 step from the reference value equals or exceeds the maximum value of the focus evaluation value when the excitation current is set at the reference value (Yes in S108), the control unit 50 shifts the excitation current of the objective lens 18 by +1 step (S110). As a result, the excitation current of the objective lens 18 is shifted by +2 steps from the reference value.

With the excitation current of the objective lens 18 shifted by +2 steps from the reference value, the control unit 50 varies the stigma correction value of the astigmatism corrector 16 in order to find the stigma correction value at which the focus evaluation value is maximized (S112). The processing of step S112 is performed in a similar manner to the processing of step S102. Thus, the optimum value of the stigma correction value when the excitation current of the objective lens 18 is shifted by +2 steps from the reference value can be acquired.

Next, the control unit 50 compares the maximum value of the focus evaluation value when the excitation current of the objective lens 18 is shifted by +1 step from the reference value, acquired in the processing of step S106, with the maximum value of the focus evaluation value when the excitation current of the objective lens 18 is shifted by +2 steps from the reference value, acquired in the processing of step S112 (S114).

Having determined that the maximum value of the focus evaluation value when the excitation current is shifted by +2 steps from the reference value equals or exceeds the maximum value of the focus evaluation value when the excitation current is shifted by +1 step from the reference value (Yes in S114), the control unit 50 returns to step S110 and shifts the excitation current of the objective lens 18 by +1 step (S110). As a result, the excitation current of the objective lens 18 is shifted by +3 steps from the reference value. The control unit 50 then performs the processing of step S112 and the processing of step S114.

The control unit 50 repeats the processing of step S110, step S112, and step S114 until the maximum value of the focus evaluation value after shifting the excitation current of the objective lens 18 by +1 step becomes smaller than the maximum value of the focus evaluation value before shifting the excitation current of the objective lens 18 by +1 step.

Having determined, for example, that the maximum value of the focus evaluation value when the excitation current is shifted by +2 steps from the reference value is smaller than the maximum value of the focus evaluation value when the excitation current is shifted by +1 step from the reference value (No in S114), the control unit 50 sets a state in which the excitation current is shifted by +1 step from the reference value as the optimum value of the excitation current of the objective lens 18 and sets the optimum value of the stigma correction value when the excitation current is shifted by +1 step from the reference value as the optimum value of the stigma correction value of the astigmatism corrector 16 (S116). The control unit 50 then sets the excitation current of the objective lens 18 at the optimum value and sets the stigma correction value of the astigmatism corrector 16 at the optimum value. As a result, focusing is achieved and astigmatism is corrected.

Having determined that the maximum value of the focus evaluation value when the excitation current is shifted by +1 step from the reference value is smaller than the maximum value of the focus evaluation value when the excitation current is set at the reference value (No in S108), the control unit 50 shifts the excitation current of the objective lens 18 by −2 steps (S118). As a result, the excitation current of the objective lens 18 is shifted by −1 step from the reference value.

With the excitation current of the objective lens 18 shifted by −1 step from the reference value, the control unit 50 varies the stigma correction value of the astigmatism corrector 16 in order to find the stigma correction value at which the focus evaluation value is maximized (S120). The processing of step S120 is performed in a similar manner to the processing of step S102. Thus, the optimum value of the stigma correction value when the excitation current of the objective lens 18 is shifted by −1 step from the reference value can be acquired.

Next, the control unit 50 compares the maximum value of the focus evaluation value when the excitation current of the objective lens 18 is set at the reference value, acquired in the processing of step S102, with the maximum value of the focus evaluation value when the excitation current of the objective lens 18 is shifted by −1 step from the reference value, acquired in the processing of step S120 (S122).

Having determined that the maximum value of the focus evaluation value when the excitation current is shifted by −1 step from the reference value equals or exceeds the maximum value of the focus evaluation value when the excitation current is set at the reference value (Yes in S122), the control unit 50 shifts the excitation current of the objective lens 18 by −1 step (S124). As a result, the excitation current of the objective lens 18 is shifted by −2 steps from the reference value.

With the excitation current of the objective lens 18 shifted by −2 steps from the reference value, the control unit 50 varies the stigma correction value of the astigmatism corrector 16 in order to find the stigma correction value at which the focus evaluation value is maximized (S126). The processing of step S126 is performed in a similar manner to the processing of step S102. Thus, the optimum value of the stigma correction value when the excitation current of the objective lens 18 is shifted by −2 steps from the reference value can be acquired.

Next, the control unit 50 compares the maximum value of the focus evaluation value when the excitation current of the objective lens 18 is shifted by −1 step from the reference value, acquired in the processing of step S120, with the maximum value of the focus evaluation value when the excitation current of the objective lens 18 is shifted by −2 steps from the reference value, acquired in the processing of step S126 (S128).

Having determined that the maximum value of the focus evaluation value when the excitation current is shifted by −2 steps from the reference value equals or exceeds the maximum value of the focus evaluation value when the excitation current is shifted by −1 step from the reference value (Yes in S128), the control unit 50 returns to step S124 and shifts the excitation current of the objective lens 18 by −1 step (S124). As a result, the excitation current of the objective lens 18 is shifted by −3 steps from the reference value. The control unit 50 then performs the processing of step S126 and the processing of step S128.

The control unit 50 repeats the processing of step S124, step S126, and step S128 until the maximum value of the focus evaluation value after shifting the excitation current of the objective lens 18 by −1 step becomes smaller than the maximum value of the focus evaluation value before shifting the excitation current of the objective lens 18 by −1 step.

Having determined, for example, that the maximum value of the focus evaluation value when the excitation current is shifted by −2 steps from the reference value is smaller than the maximum value of the focus evaluation value when the excitation current is shifted by −1 step from the reference value (No in S128), the control unit 50 sets a state in which the excitation current is shifted by −1 step from the reference value as the optimum value of the excitation current of the objective lens 18 and sets the optimum value of the stigma correction value when the excitation current is shifted by −1 step from the reference value as the optimum value of the stigma correction value of the astigmatism corrector 16 (S116). The control unit 50 then sets the excitation current of the objective lens 18 at the optimum value and sets the stigma correction value of the astigmatism corrector 16 at the optimum value. As a result, focusing is achieved and astigmatism is corrected.

3. Effects

The focus adjustment method for the electron microscope 100 includes acquiring a plurality of SEM images having different focuses by varying the excitation current of the objective lens 18 within the focus search range, and determining the reference value of the excitation current of the objective lens 18 based on the plurality of SEM images, removing hysteresis from the objective lens 18 by setting the excitation current of the objective lens 18 outside the focus search range before varying the excitation current of the objective lens 18 within the focus search range, and removing hysteresis from the objective lens 18 by setting the excitation current of the objective lens 18 outside the focus search range after varying the excitation current of the objective lens 18 within the focus search range. The focus adjustment method also includes acquiring a plurality of SEM images having different focuses and different astigmatisms by varying the excitation current of the objective lens 18 using the reference value of the excitation current as a reference and varying the stigma correction value of the astigmatism corrector 16 at each excitation current, and then determining the optimum value of the excitation current and the optimum value of the stigma correction value based on the plurality of SEM images.

Hence, with the focus adjustment method for the electron microscope 100, hysteresis is removed from the objective lens 18 before and after the excitation current of the objective lens 18 is varied within the focus search range, or in other words before and after the excitation current of the objective lens 18 is widely varied. As a result, the effects of hysteresis in the objective lens 18 caused by widely varying the excitation current of the objective lens 18 can be reduced.

Further, with the focus adjustment method for the electron microscope 100, the optimum value of the stigma correction value is determined by varying the excitation current of the objective lens 18 using the reference value as a reference after removing hysteresis from the objective lens 18. By varying the excitation current of the objective lens 18 using the reference value as a reference in this manner, it is possible, when determining the optimum value of the stigma correction value, to search for the optimum value of the stigma correction value using a state in which focusing has substantially been achieved as a reference. Hence, the amount by which the excitation current of the objective lens 18 is varied while determining the optimum value of the stigma correction value can be reduced, and therefore, the effects of hysteresis in the objective lens 18 can be reduced. As a result, focus adjustment can be performed with a high degree of precision. Moreover, with the focus adjustment method for the electron microscope 100, there is no need to provide an autofocus lens exhibiting little hysteresis, for example, and therefore the size of the device can be reduced.

With the focus adjustment method for the electron microscope 100, during the step for determining the reference value of the excitation current of the objective lens 18, or in other words during the processing of step S12, the excitation current of the objective lens 18 is varied only from the lower limit of the focus search range toward the upper limit. By varying the excitation current of the objective lens 18 only from weak excitation toward strong excitation in this manner, the effects of hysteresis in the objective lens 18 can be reduced.

In the electron microscope 100, the control unit 50 performs processing for acquiring a plurality of SEM images having different focuses by varying the excitation current of the objective lens 18 within the focus search range, and determining the reference value of the excitation current based on the plurality of SEM images, processing for removing hysteresis from the objective lens 18 by setting the excitation current of the objective lens 18 outside the focus search range before varying the excitation current of the objective lens 18 within the focus search range, and processing for removing hysteresis from the objective lens 18 by setting the excitation current of the objective lens 18 outside the focus search range after varying the excitation current of the objective lens 18 within the focus search range. The control unit 50 also performs processing for acquiring a plurality of SEM images having different focuses and different astigmatisms by varying the excitation current of the objective lens 18 using the reference value of the excitation current as a reference and varying the stigma correction value of the astigmatism corrector 16 at each excitation current, and then determining the optimum value of the excitation current and the optimum value of the stigma correction value based on the plurality of SEM images. With the electron microscope 100, therefore, the effects of hysteresis in the objective lens 18 can be reduced during focus adjustment, and as a result, focus adjustment can be performed with a high degree of precision.

4. Modified Examples

The invention is not limited to the above-described embodiments, and various modifications can be made within the scope of the invention.

In the above embodiment, the objective lens 18 is varied in one direction from weak excitation to strong excitation during the processing of step S12 illustrated in FIG. 2, but the objective lens 18 may be varied in one direction from strong excitation to weak excitation. More specifically, for example, after setting the excitation current of the objective lens 18 at stronger excitation than the focus search range, the excitation current of the objective lens 18 may be set at the upper limit current of the focus search range, and then, while varying the excitation current of the objective lens 18 in one direction from the upper limit toward the lower limit of the focus search (in other words, while varying the objective lens 18 from strong excitation to weak excitation), a SEM image may be acquired at each excitation current and a focus evaluation value may be determined from the corresponding SEM image.

In the focus adjustment method for the electron microscope 100 thus configured, during the step for determining the reference value of the excitation current of the objective lens 18, or in other words during the processing of step S12, the excitation current of the objective lens 18 may be varied only from the upper limit of the focus search range toward the lower limit. By varying the excitation current of the objective lens 18 only from strong excitation toward weak excitation in this manner, the effects of hysteresis in the objective lens 18 can be reduced.

Further, for example, the invention includes configurations that are substantially the same as the configurations described in the embodiments. Substantially same configurations means configurations that are the same in function, method, and results, or configurations that are the same in objective and effects, for example. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A focus adjustment method for a charged particle beam device having a magnetic field lens used for focus adjustment and an astigmatism corrector, the focus adjustment method comprising:
    acquiring a plurality of first images having different focuses by varying an excitation current of the magnetic field lens within a focus search range, and determining a reference value of the excitation current of the magnetic field lens based on the plurality of first images;
    removing hysteresis from the magnetic field lens by setting the excitation current of the magnetic field lens outside the focus search range before varying the excitation current of the magnetic field lens within the focus search range;
    removing hysteresis from the magnetic field lens by setting the excitation current of the magnetic field lens outside the focus search range after varying the excitation current of the magnetic field lens within the focus search range; and
    acquiring a plurality of second images having different focuses and different astigmatisms by varying the excitation current of the magnetic field lens using the reference value as a reference and varying a stigma correction value of the astigmatism corrector at each excitation current, and then determining an optimum value of the excitation current of the magnetic field lens and an optimum value of the stigma correction value based on the plurality of second images.

2. The focus adjustment method for a charged particle beam device according to claim 1, wherein, in determining the reference value, the excitation current of the magnetic field lens is varied only from a lower limit of the focus search range toward an upper limit of the focus search range.

3. The focus adjustment method for a charged particle beam device according to claim 1, wherein, in determining the reference value, the excitation current of the magnetic field lens is varied only from an upper limit of the focus search range toward a lower limit of the focus search range.

4. A charged particle beam device comprising:
    a magnetic field lens used for focus adjustment;
    an astigmatism corrector; and
    a control unit for controlling the magnetic field lens and the astigmatism corrector,
    the control unit configured to perform processing to:
    acquire a plurality of first images having different focuses by varying an excitation current of the magnetic field lens within a focus search range, and determine a reference value of the excitation current of the magnetic field lens based on the plurality of first images;
    remove hysteresis from the magnetic field lens by setting the excitation current of the magnetic field lens outside the focus search range before varying the excitation current of the magnetic field lens within the focus search range;
    remove hysteresis from the magnetic field lens by setting the excitation current of the magnetic field lens outside the focus search range after varying the excitation current of the magnetic field lens within the focus search range; and
    acquire a plurality of second images having different focuses and different astigmatisms by varying the excitation current of the magnetic field lens using the reference value as a reference and varying a stigma correction value of the astigmatism corrector at each excitation current, and then determine an optimum value of the excitation current of the magnetic field lens and an optimum value of the stigma correction value based on the plurality of second images.

5. The charged particle beam device according to claim 4, wherein, in determining the reference value, the excitation current of the magnetic field lens is varied only from a lower limit of the focus search range toward an upper limit of the focus search range.

6. The charged particle beam device according to claim 4, wherein, in determining the reference value, the excitation current of the magnetic field lens is varied only from an upper limit of the focus search range toward a lower limit of the focus search range.

* * * * *